(12) United States Patent
Uneme et al.

(10) Patent No.: US 6,710,625 B2
(45) Date of Patent: Mar. 23, 2004

(54) SEMICONDUCTOR INTEGRATED CIRCUIT HAVING A GATE ARRAY STRUCTURE

(75) Inventors: Yutaka Uneme, Tokyo (JP); Hideaki Nagasawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/152,007

(22) Filed: May 22, 2002

(65) Prior Publication Data

US 2003/0117168 A1 Jun. 26, 2003

(30) Foreign Application Priority Data

Dec. 20, 2001 (JP) .......................... 2001-387222

(51) Int. Cl.[7] .................. H03K 19/177; H03K 19/00
(52) U.S. Cl. .................. 326/41; 326/101; 326/113
(58) Field of Search .................. 326/41, 47, 44, 326/45, 49, 101, 112–114

(56) References Cited

U.S. PATENT DOCUMENTS 4,897,563 A * 1/1990 Bahl ........................... 326/13
5,280,201 A * 1/1994 Fujimori et al. ............ 326/112
5,471,422 A 11/1995 Chang et al.
6,480,034 B1 * 11/2002 Matsudera et al. ......... 326/113

FOREIGN PATENT DOCUMENTS

JP    5-190801    7/1993
JP    7-297304    11/1995

* cited by examiner

*Primary Examiner*—James H. Cho
(74) *Attorney, Agent, or Firm*—Leydig, Voit & Mayer, Ltd.

(57) ABSTRACT

In a semiconductor integrated circuit having a gate array structure, within a cell, isolation transistors are disposed in series between an intra-cell gate output terminal and an intra-cell power supply wiring section, or between the intra-cell gate output terminal and an intra-cell ground wiring section. Isolation transistors are disposed in series between an extra-cell gate output terminal and an extra-cell power supply wiring section between cells, or between the extra-cell gate output terminal and an extra-cell ground wiring section.

6 Claims, 9 Drawing Sheets

PRIOR ART

| | POWER SUPPLY WIRING SECTION 1 |
|---|---|
| | GROUND WIRING SECTION 2 |
| | SIGNAL WIRING SECTION 3 |
| | ISOLATION TRANSISTOR 4 (4A, 4B AND 4C) |

SEMICONDUCTOR INTEGRATED CIRCUIT HAVING A GATE ARRAY STRUCTURE

FIELD OF THE INVENTION

The present invention relates to a semiconductor integrated circuit having a gate array structure in which leakage currents can be reduced in a gate array or an embedded cell array, which is a kind of the gate array.

BACKGROUND OF THE INVENTION

In recent years, increases in speed and degree of integration of semiconductor integrated circuits have advanced by development of fine pattern techniques. In such semiconductor integrated circuits, reduction in power dissipation poses one great problem. For example, in semiconductor integrated circuits, such as a gate array formed by spreading a large number of transistors all over, and an embedded cell array (hereafter abbreviated to ECA) which is a cell base semiconductor integrated circuit formed by embedding gate arrays as large scale macros, gate lengths of transistors are becoming smaller. This results in a problem of increased leakage currents and consequent increased power dissipation.

That is, owing to finer smaller gate length, it becomes possible to perform operation fast and also it becomes possible to use many transistors, resulting in a high degree of intergration. On the other hand, the length of isolation transistors which isolate adjacent transistors from each other and of isolation transistors which isolate cells from each other in the cell array scheme is made smaller. As a result, the leakage current tends to increase and power dissipation tends to increase. On the other hand, the length of isolation transistors which isolate adjacent transistors from each other and of isolation transistors which isolate cells from each other in the cell array scheme is made finer. As a result, the leak current tends to increase and power dissipation tends to increase.

Especially in semiconductor integrated circuits such as those used in portable devices, the increase in power dissipation directly affects the battery life, and poses a very serious problem.

Figure 10:
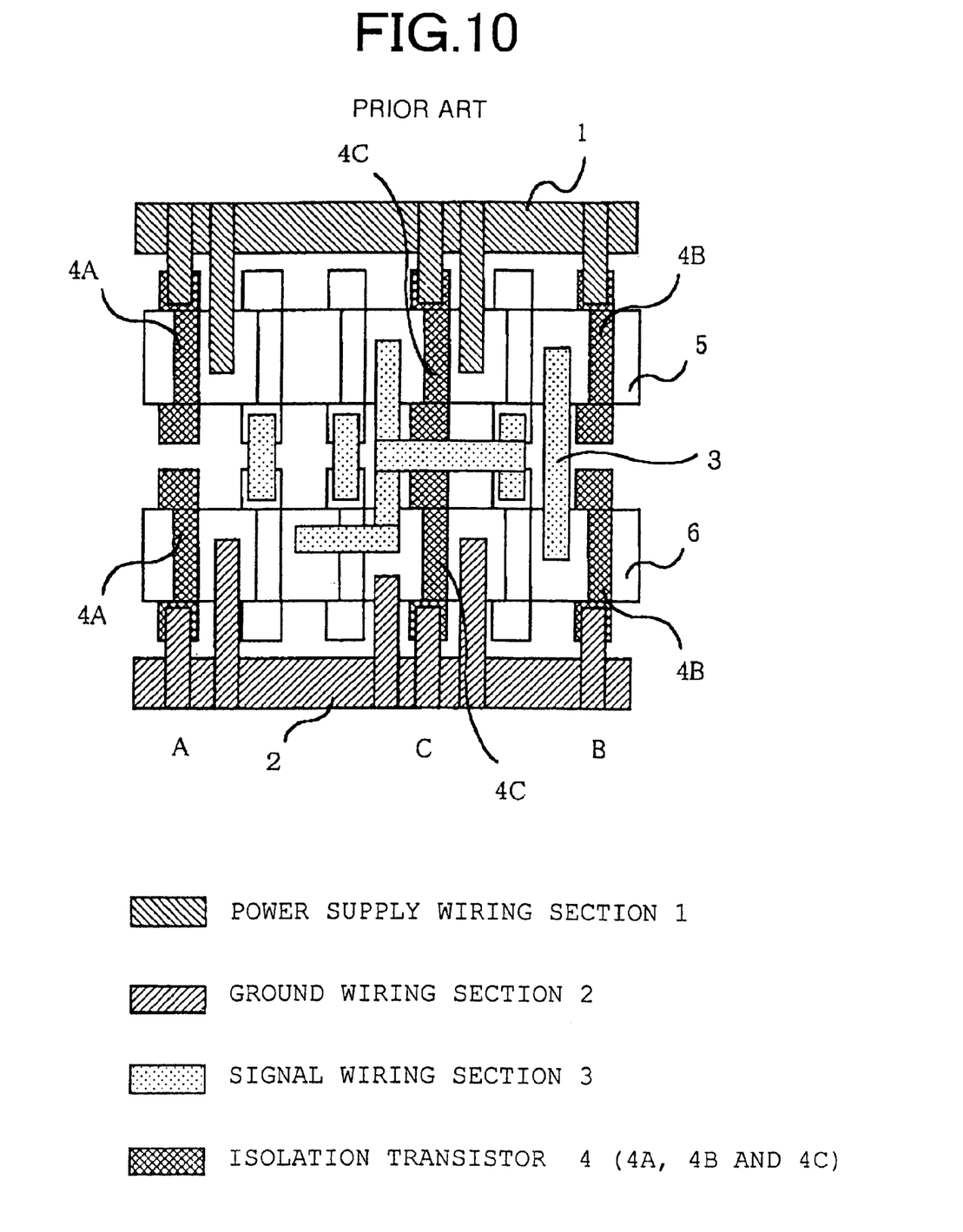
FIG. 10 is a layout which shows an internal configuration of a conventional ECA cell.

FIG. 10 shows an example of a conventional typical ECA cell. In this figure, reference numeral 1 denotes a power supply wiring section, 2 a ground wiring section, 3 a signal wiring section, 4 an isolation transistor, 5 a PMOS transistor region, and 6 an NMOS transistor region. Reference signs A, B and C denote positions in the ECA cell. That is, 4A denotes an isolation transistor 4 located in the position A, and 4B an isolation transistor 4, located in the position B. The isolation transistor 4 is a transistor which is always held in the off-state by connecting a PMOS transistor at its gate to the power supply wiring section 1 or connecting an NMOS transistor at its gate to the ground wiring section 2, and which thereby functions to electrically isolate right and left active areas from each other.

Figure 11:
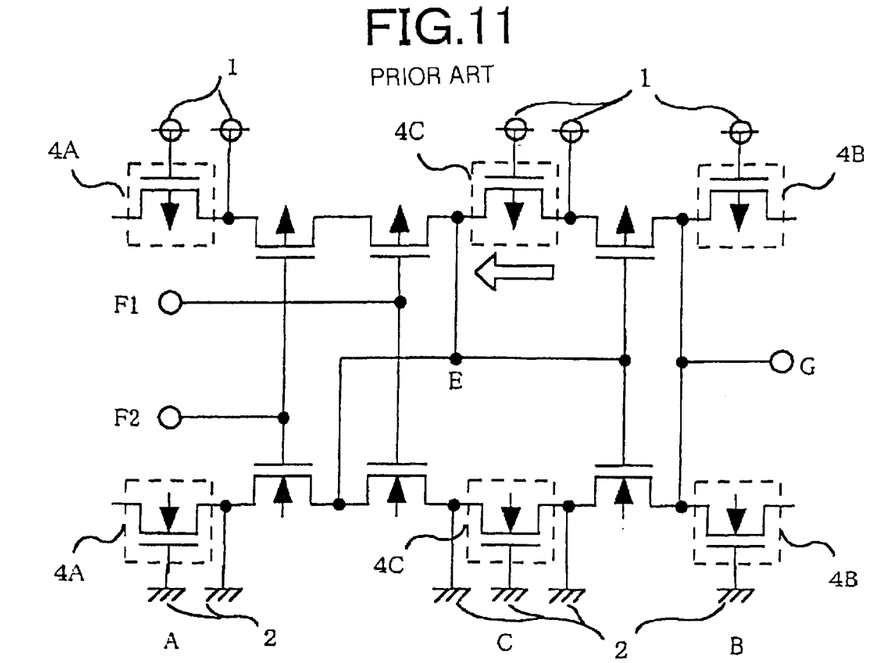
FIG. 11 is a circuit diagram which shows the internal configuration of the conventional ECA cell.

FIG. 11 is a circuit diagram which shows the ECA cell of FIG. 10. A NOR circuit is located between the positions A and C. An inverter circuit is located between the positions C and B. As a whole, the cell forms an OR cell. F1 and F2 denote input terminals of the two-input NOR circuit, and G denotes an output terminal of an extra-cell gate in the OR cell. An output terminal of an intra-cell gate is supplied to a node E. Intra-cell gates indicate circuits, each of which is independent and has an individual function, within a cell having some function as a whole. The cell as a whole is the OR cell located between the positions A and B. The NOR circuit located between the positions A and C, and the inverter circuit located between the positions C and B correspond to the intra-cell gates, respectively. Each of the individual independent circuit units may be a logic circuit or a sequence circuit.

In FIG. 11, if the signal at the node E is at high logical level ("H"), there is no problem in particular. If the signal is at low logical level ("L"), however, a leak current occurs from the intra-cell power supply wiring section 1 through the PMOS isolation transistor 4C in a direction indicated by an arrow, posing a problem.

Figure 12:
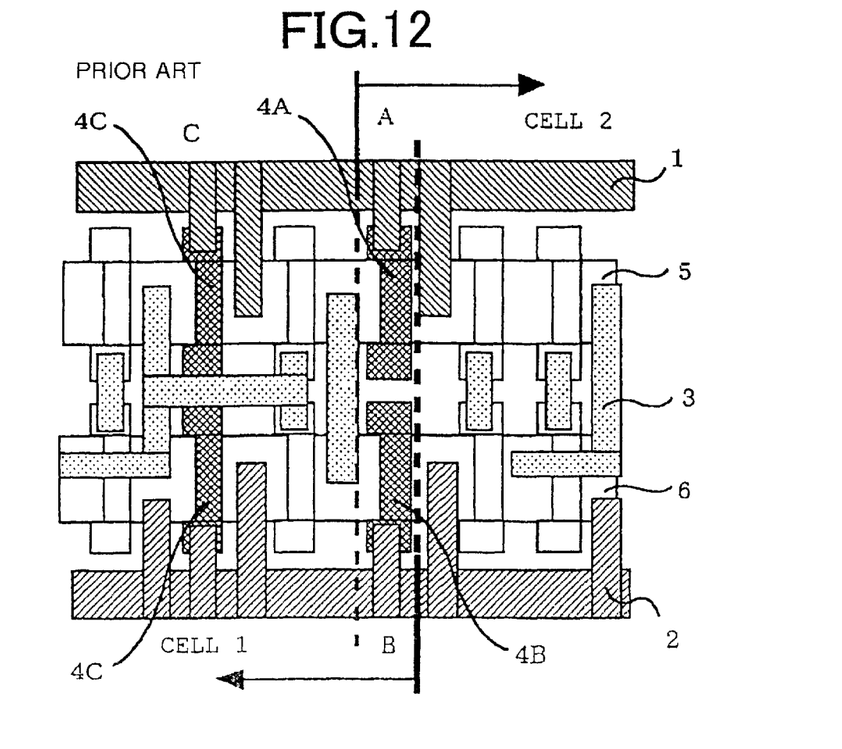
FIG. 12 is a layout which shows a configuration between the conventional ECA cells.

FIG. 12 shows an example of a state between cells in conventional typical ECA cells. In this figure, the same characters are assigned to the components corresponding to those in FIG. 10. When conventionally designing the arrangement of adjacent cells 1 and 2, isolation transistors 4 at ends of respective cells are overlapped in order to increase the degree of integration.

Figure 13:
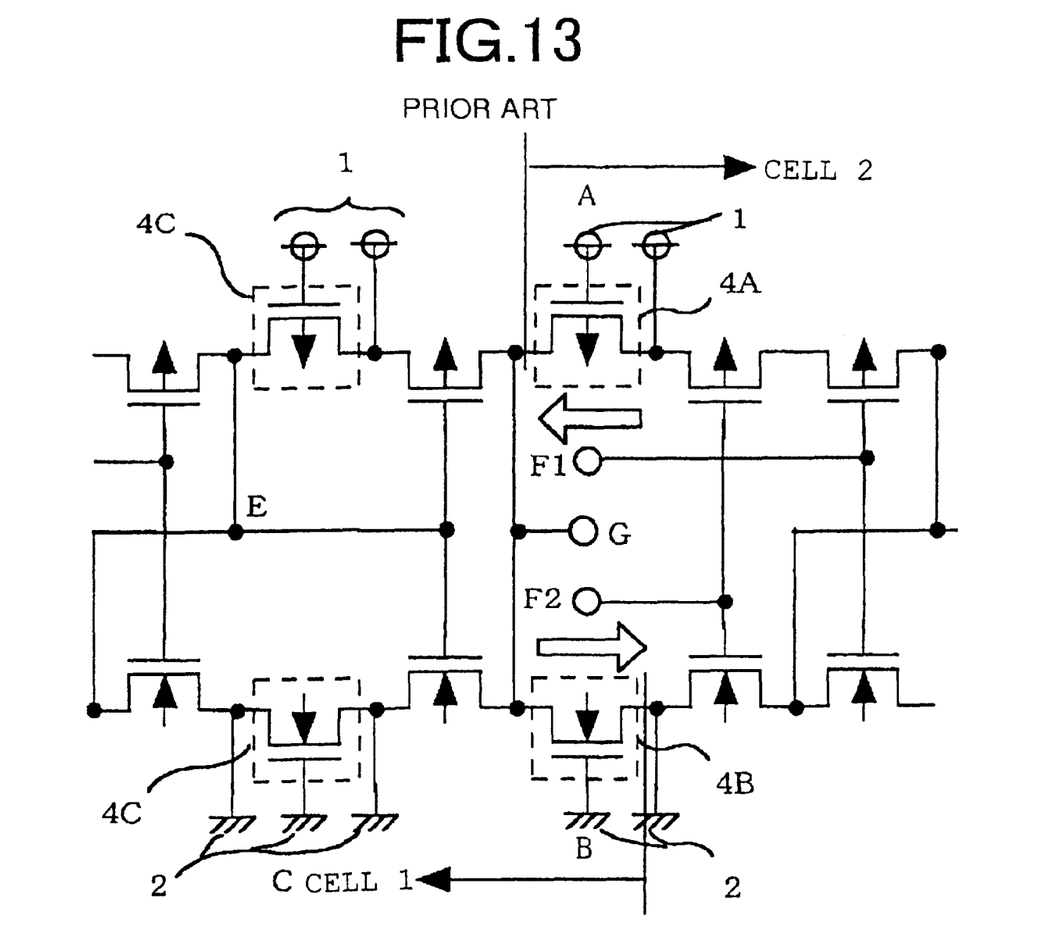
FIG. 13 is a circuit diagram which shows the configuration between the conventional ECA cells.

FIG. 13 is a circuit diagram which shows a section between ECA cells shown in FIG. 12, in which OR cells are disposed adjacently. F1 and F2 denote input terminals of the cell 2, and G denotes an output terminal of an extra-cell gate of the cell 1. If the signal at the output terminal of the extra-cell gate is H, then a leak current flows to a ground wiring section 2 through an NMOS isolation transistor 4B. If the signal at the output terminal G of the extra-cell gate is L, then a leak current flows from the power supply wiring section 1 located outside the cell through a PMOS isolation transistor 4A in a direction of an arrow, posing a problem.

SUMMARY OF THE INVENTION

It is an object of the present invention to provide a semiconductor integrated circuit of a gate array structure with which reduction in power dissipation has been achieved while coping with the finer gate length. Herein, the semiconductor integrated circuit of gate array structure is a concept including an embedded array block (EAB) or an embedded cell array (ECA), not to speak of a gate array.

The semiconductor integrated circuit of gate array structure according to one aspect of the present invention, comprises an intra-cell gate output section, an intra-cell power supply wiring section, and a plurality of isolation transistors disposed in series between the intra-cell gate output section and the intra-cell power supply wiring section.

The semiconductor integrated circuit of gate array structure according to another aspect of this invention, comprises an intra-cell gate output section, an intra-cell ground wiring section, and a plurality of isolation transistors disposed in series between the intra-cell gate output section and the intra-cell ground wiring section.

The semiconductor integrated circuit of gate array structure according to still another aspect of the present invention, comprises an intra-cell gate output section, an intra-cell first power supply wiring section, and a plurality of first isolation transistors disposed in series between the intra-cell gate output section and the intra-cell first power supply wiring section. This semiconductor integrated circuit also comprises an intra-cell second power supply wiring section and a plurality of second isolation transistors disposed in series between the intra-cell gate output section and the intra-cell second power supply wiring section.

The semiconductor integrated circuit of gate array structure according to still another aspect of the present invention, comprises an extra-cell gate output section, an extra-cell power supply wiring section in an adjacent cell, and a plurality of isolation transistors disposed in series between the extra-cell gate output section and the extra-cell power supply wiring section in the adjacent cell.

The semiconductor integrated circuit of gate array structure according to still another aspect of the present invention, comprises an extra-cell gate output section, an extra-cell ground wiring section in an adjacent cell, and a plurality of isolation transistors disposed in series between the extra-cell gate output section and the extra-cell ground wiring section in the adjacent cell.

The semiconductor integrated circuit of gate array structure according to still another aspect of the present invention, comprises an extra-cell gate output section, an extra-cell first power supply wiring section in an adjacent cell, and a plurality of first isolation transistors disposed in series between the extra-cell gate output section and the extra-cell first power supply wiring section in the adjacent cell. The semiconductor integrated circuit also comprises an extra-cell second power supply wiring section in the adjacent cell and a plurality of second isolation transistors disposed in series between the extra-cell gate output section and the extra-cell second power supply wiring section in the adjacent cell.

Other objects and features of this invention will become apparent from the following description with reference to the accompanying drawings.

DETAILED DESCRIPTIONS

Embodiments of the present invention will be explained in detail below with reference to the accompanying drawings.

Figure 1:
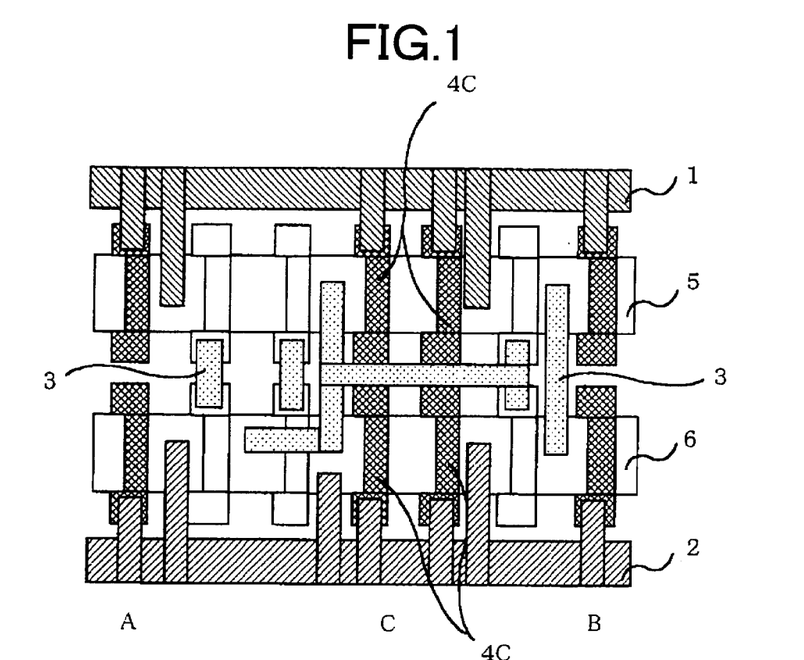
FIG. 1 is a layout which shows an internal configuration of an ECA cell in a first embodiment of this invention.

FIG. 1 shows a first embodiment of this invention. The configuration of this figure is completely the same as that of FIG. 10 except for the PMOS isolation transistor 4C and the NMOS isolation transistor 4C, each of which is paired and connected in series.

Such series connection of two or more isolation transistors 4 has an effect similar to lengthening the gate length of the isolation transistor 4. That is, if the gate length becomes longer, the drain current decreases. If the drain current decreases, the leak current also decreases. As a result, the isolation transistors 4 having the structure shown in this embodiment can suppress the leak current.

Figure 2:
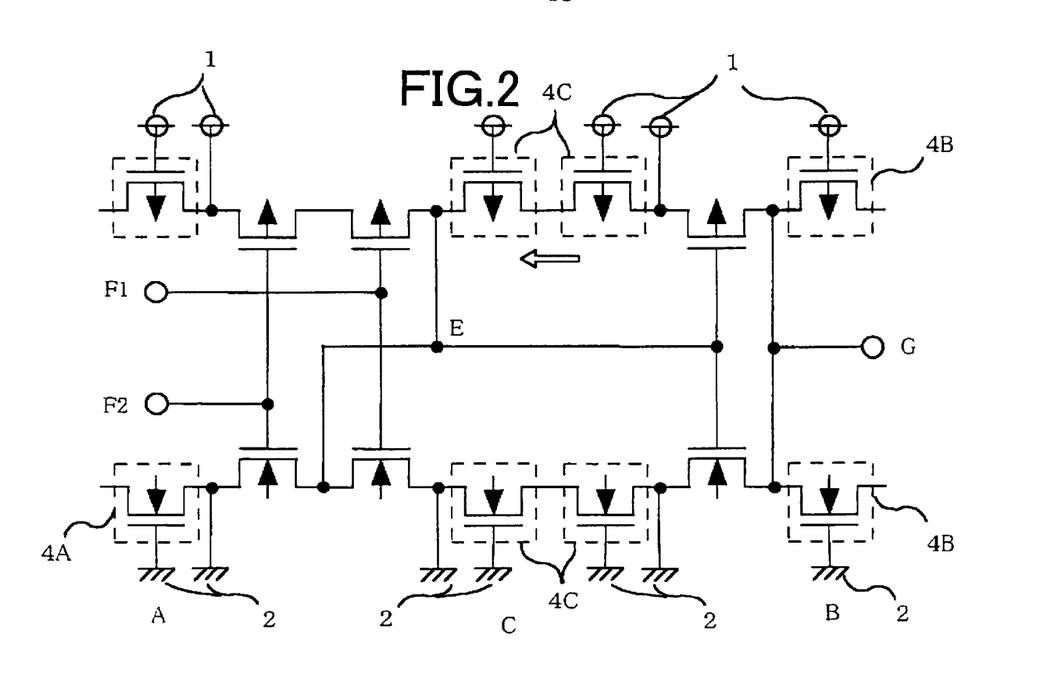
FIG. 2 is a circuit diagram which shows the internal configuration of the ECA cell in the first embodiment.

FIG. 2 shows the circuit diagram based on FIG. 1. Even if a signal at a node E, to which an output of the intra-cell gate is supplied shown in FIG. 2, is L, a leak current flowing from a power supply wiring section 1 in a direction indicated by an arrow can be remarkably reduced as compared with that of FIG. 11, because the PMOS isolation transistor 4C in this figure is formed of two PMOS transistors connected in series.

When a NOR circuit is formed between A and C as in the configuration of FIG. 2, a leak current which flows to a ground wiring section 2 does not especially occur even if the signal at the node E is H. Therefore, there is no problem even if the NMOS isolation transistor 4C is formed of one NMOS transistor in the same way as the conventional configuration.

If there is any room in device area of the semiconductor integrated circuit and the leak current should be suppressed, it is also possible to form the PMOS isolation transistor 4C of three PMOS transistors and the NMOS isolation transistor 4C of one NMOS transistor in the same way as the conventional configuration or even two NMOS transistors.

Figure 3:
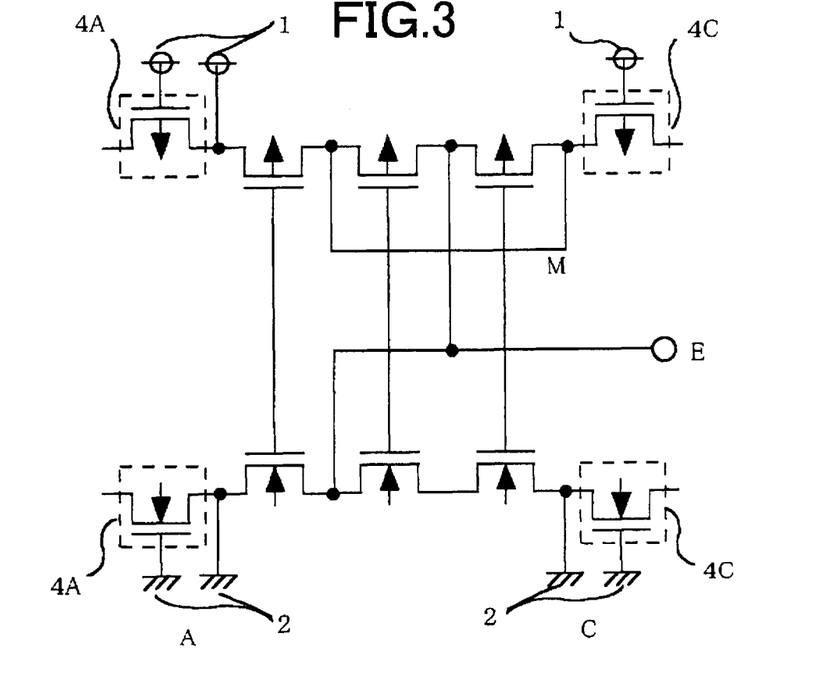
FIG. 3 is a circuit diagram which shows the internal configuration of the ECA cell in the first embodiment.

If the isolation transistor 4 is in contact with an intermediate node, it is not necessary in some cases to especially dispose a plurality of transistors for the purpose of reinforcement. Such a case is shown in FIG. 3. The potential at a node M of FIG. 3 lowers to only approximately one half of the power supply voltage at most. Therefore, a magnitude of the leak current flowing through the PMOS isolation transistor 4C is so small that it may be ignored in practical use. In such a case, it is not necessary to especially reinforce the PMOS isolation transistor 4C against the leak current.

Figure 4:
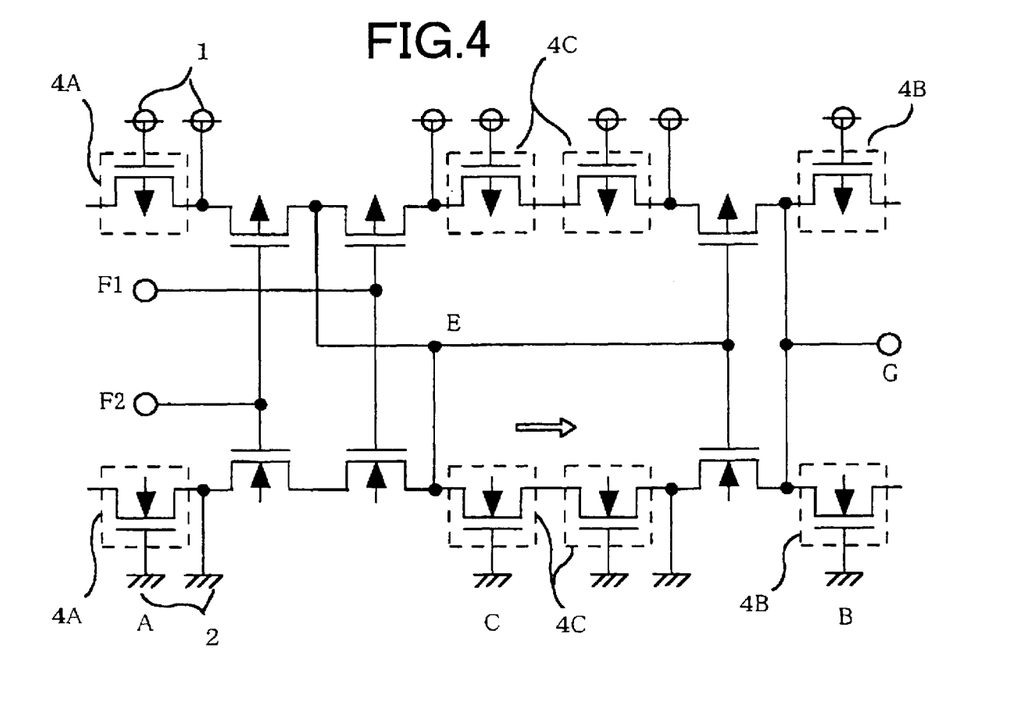
FIG. 4 is a circuit diagram which shows an internal configuration of an ECA cell in a second embodiment of this invention.

FIG. 4 shows a second embodiment of the present invention. FIG. 4 is a circuit diagram which shows an ECA cell. A NAND circuit is formed between the positions A and C. An inverter circuit is formed between the positions C and B. As a whole, the cell forms an AND cell. In this figure, F1 and F2 denote input terminals of the two-input NAND circuit, and G denotes an output terminal of an extra-cell gate.

In the conventional configuration, the isolation transistors 4C are respectively formed of one NMOS transistor and one PMOS transistor as shown in FIG. 11. As shown in FIG. 4, however, each of the isolation transistors 4C is formed of two transistors connected in series.

In the same manner as the first embodiment, such series connection of two or more isolation transistors 4 has an effect similar to lengthening the gate length of the isolation transistor 4. As a result, the leak current can be suppressed.

That is, even if a signal at the node E shown in FIG. 4 is H, a leak current flowing to a ground wiring section 2 in a direction indicated by an arrow can be remarkably reduced as compared with the conventional configuration, because the NMOS isolation transistor 4C is formed of two NMOS transistors connected in series.

When a NAND circuit is formed between A and C as in the configuration of FIG. 4, a leak current which flows from the power supply wiring section 1 does not especially occur, even if the signal at the node E is L. Therefore, there is no problem even if the PMOS isolation transistor 4C is formed of one PMOS transistor in the same way as the conventional configuration.

Figure 5:
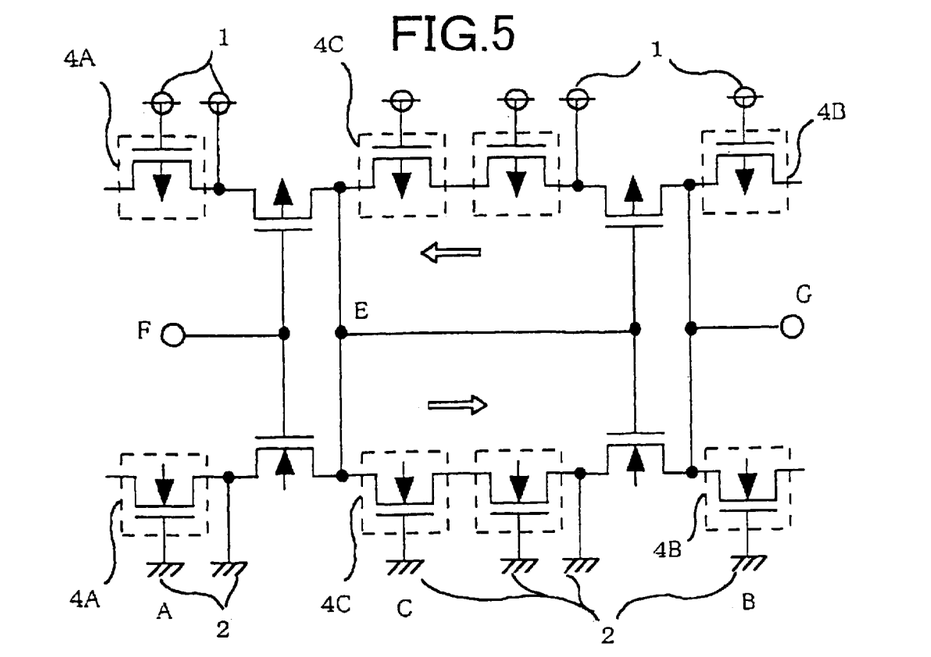
FIG. 5 is a circuit diagram which shows an internal configuration of an ECA cell in a third embodiment of this invention.

FIG. 5 shows a third embodiment of the present invention. FIG. 5 is a circuit diagram which shows an ECA cell. An inverter circuit is formed between the positions A and C. Another inverter circuit is formed between the positions C and B. As a whole, the ECA cell forms a through cell. In this figure, F denotes an input terminal of the inverter circuit, and G denotes an output terminal of an extra-cell gate.

In the conventional configuration, the isolation transistors 4 are respectively formed of one NMOS transistor 4C and one PMOS transistor 4C. In FIG. 5, however, each of the isolation transistors 4C is formed of two transistors connected in series.

Such series connection of two or more isolation transistors 4 has an effect similar to lengthening the gate length of the isolation transistor 4. As a result, the leak current can be suppressed.

That is, even if a signal at the node E shown in FIG. 5 is L, a leak current flowing from the power supply wiring section 1 in a direction indicated by an arrow can be remarkably reduced as compared with the conventional configuration, because the PMOS isolation transistor 4C in this figure is formed of two PMOS transistors connected in series. Even if the signal at the node E is H, a leak current flowing to the ground wiring section 2 in a direction indicated by an arrow can be remarkably reduced as compared with the conventional configuration, because the NMOS isolation transistor 4C in this figure is formed of two NMOS transistors connected in series.

Figure 6:
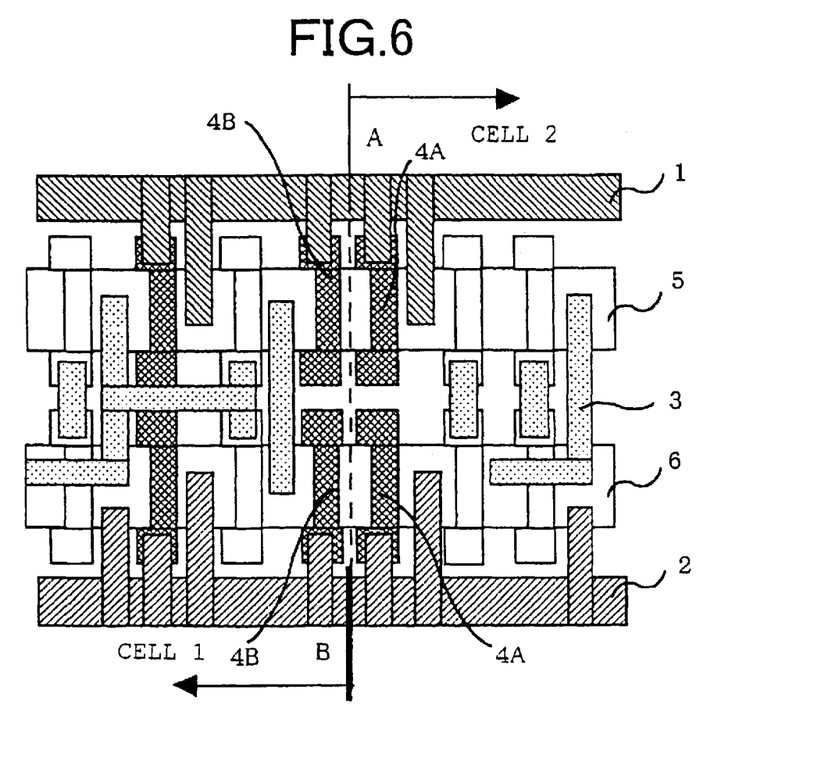
FIG. 6 is a layout which shows a configuration between ECA cells in a fourth embodiment of this invention.

FIG. 6 shows a fourth embodiment of the present invention. The configuration of FIG. 6 is completely the same as that of FIG. 12 except in a B section in a cell 1 and an A section in a cell 2 in which an isolation transistor 4B and an isolation transistor 4A are disposed so as not to be overlapped.

Such series connection of two or more isolation transistors 4 has an effect similar to lengthening the gate length of the isolation transistor 4. As a result, the leak current between the cells can be suppressed.

Figure 7:
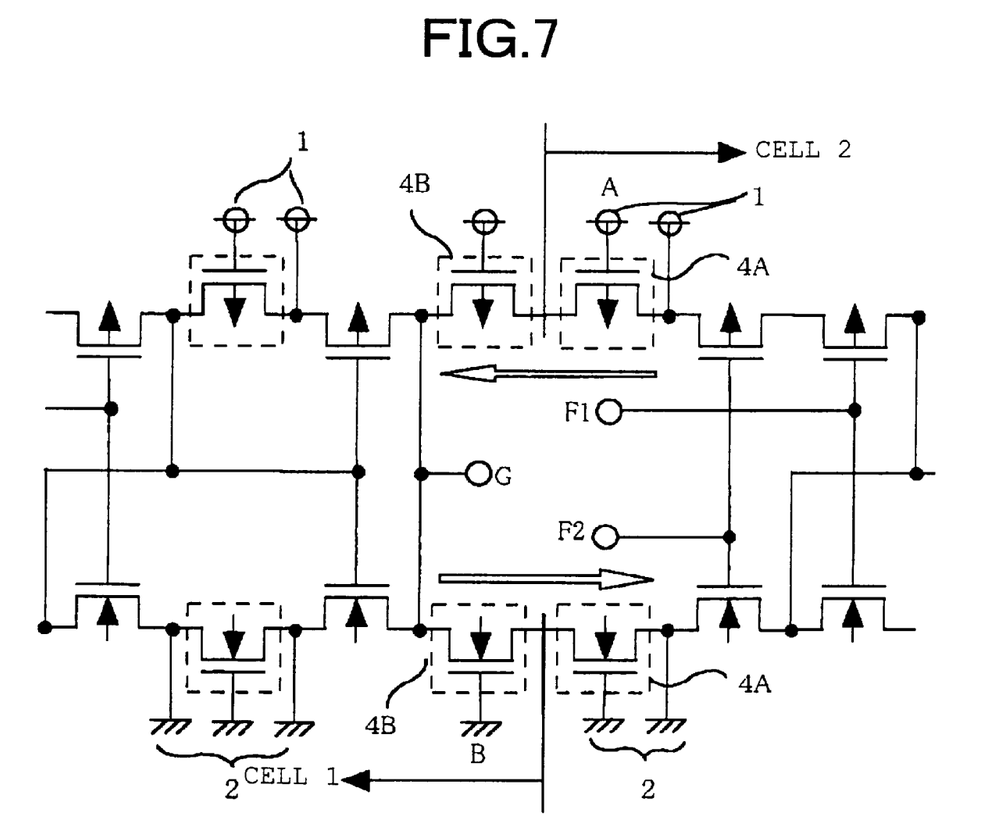
FIG. 7 is a circuit diagram which shows the configuration between the ECA cells in the fourth embodiment.

FIG. 7 shows a circuit diagram based on FIG. 6. Even if a signal at the node G to which an output of the extra-cell gate shown in FIG. 7 is supplied, is L, a leak current flowing from the extra-cell power supply wiring section 1 in a direction indicated by an arrow can be remarkably reduced as compared with that of FIG. 12, because the PMOS isolation transistors 4A and 4B in this figure are formed of two PMOS transistors connected in series. Even if the signal at the node G is H, a leak current flowing to the extra-cell ground wiring section 2 in a direction indicated by an arrow can be remarkably reduced as compared with FIG. 12, because the NMOS isolation transistors 4A and 4B in this figure are formed of two NMOS transistors connected in series.

Figure 8:
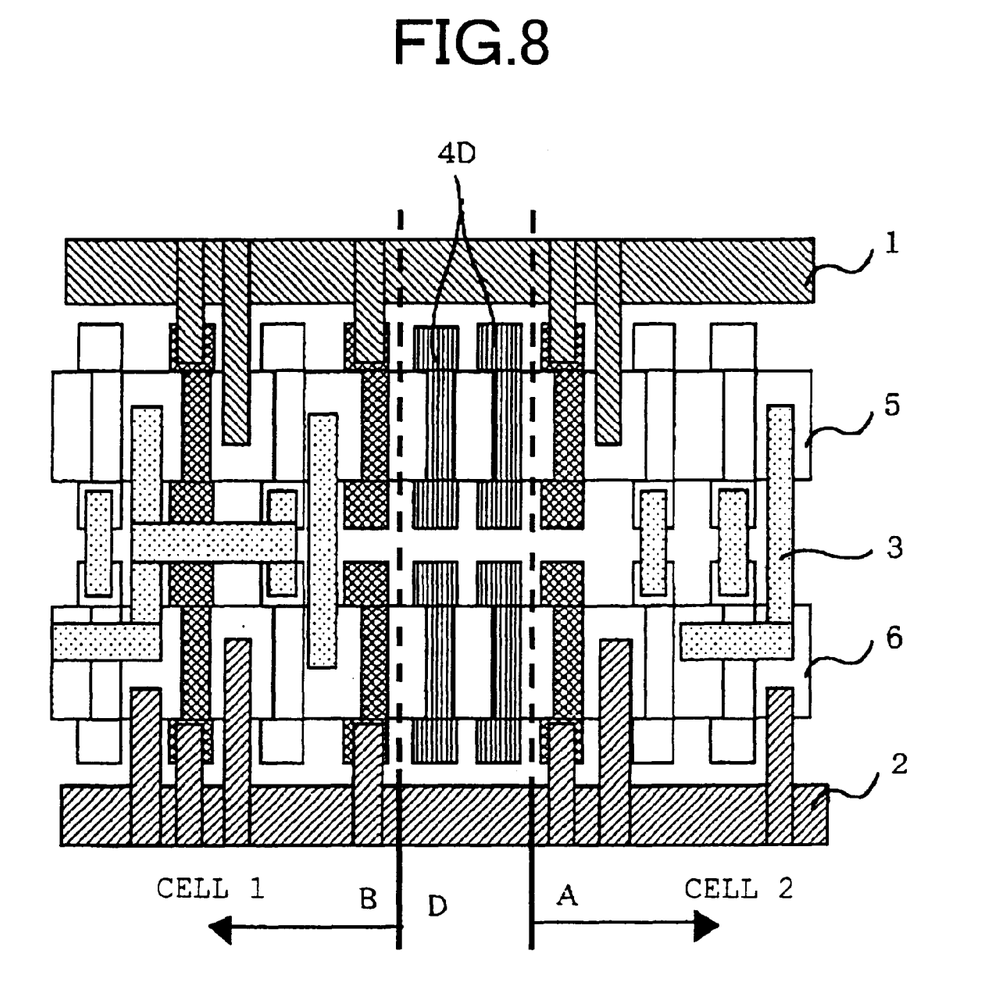
FIG. 8 is a layout which shows a configuration between ECA cells in a fifth embodiment of this invention.
Figure 9:
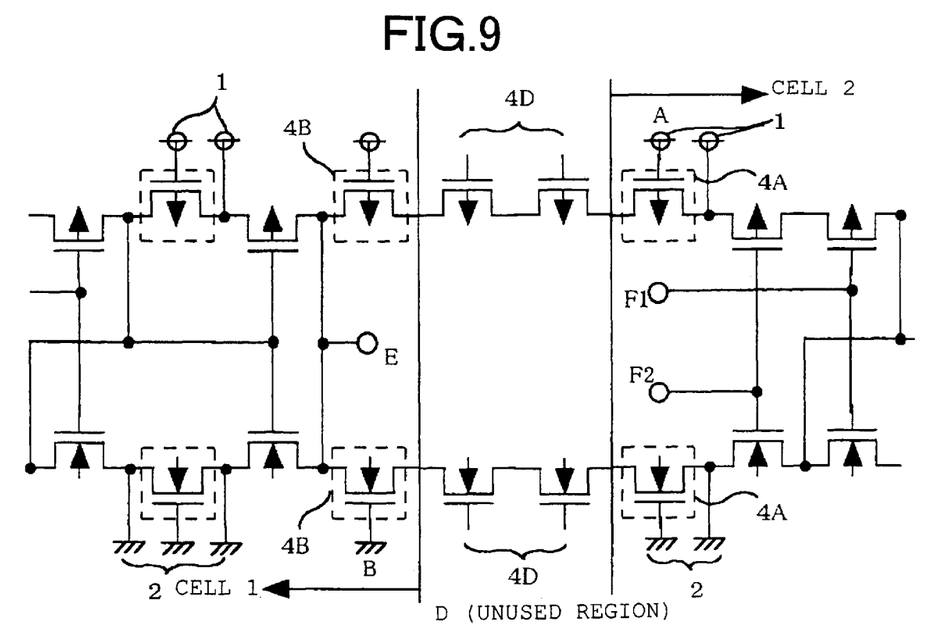
FIG. 9 is a circuit diagram which shows the configuration between the ECA cells in the fifth embodiment.

FIGS. 8 and 9 show a fifth embodiment of the present invention. A typical ECA region does not include a wiring region, and has a SOG (Sea of Gate) structure. At the time of arrangement, therefore, cells are not allowed to be adjacent and wiring is conducted so as to sometimes form unused gate regions. Such a state is shown in FIGS. 8 and 9.

As shown in FIG. 9, an unused region D exists between the cell 1 and the cell 2. Such a gate that is not connected to any place and is electrically floating keeps a certain potential by a leak current or the like. A transistor in such a state is unstable, and flows a larger amount of leak current than transistors forcibly turned off.

By connecting gates of unused PMOS transistors to the power supply wiring 1 and gates of unused NMOS transistors to the ground wiring 2, isolation transistors 4D can reduce the leak current between cells.

According to one aspect of this invention, the semiconductor integrated circuit of gate array structure is provided with a plurality of isolation transistors disposed in series between the intra-cell gate output section and the intra-cell power supply wiring section. As a result, the leak current within the cell can be reduced.

According to another aspect of this invention, the semiconductor integrated circuit of gate array structure is provided with a plurality of isolation transistors disposed in series between the intra-cell gate output section and the intra-cell ground wiring section. As a result, the leak current within the cell can be reduced.

According to still another aspect of this invention, the semiconductor integrated circuit of gate array structure is provided with the isolation transistors selectively disposed between the intra-cell gate output section and the ground wiring section or the power supply wiring section based on the configuration of the intra-cell gate. As a result, the degree of integration can be increased, and the leak current within the cell can be reduced.

According to still another aspect of this invention, the semiconductor integrated circuit of gate array structure is provided with a plurality of isolation transistors disposed in series between the extra-cell gate output section and the extra-cell power supply wiring section. As a result, the leak current between the cells can be reduced.

According to still another aspect of this invention, the semiconductor integrated circuit of gate array structure is provided with a plurality of isolation transistors disposed in series between the extra-cell gate output section and the extra-cell ground wiring section. As a result, the leak current between the cells can be reduced.

According to still another aspect of this invention, the semiconductor integrated circuit of gate array structure is provided with the isolation transistors selectively disposed between the extra-cell gate output section and the ground wiring section or the power supply wiring section based on the configuration between adjacent cells. As a result, the degree of integration can be increased, and the leak current between the cells can be reduced.

According to still another aspect of this invention, the semiconductor integrated circuit of gate array structure has an unused gate region between adjacent cells that can be utilized effectively as an isolation transistor. As a result, the leak current between the cells can be reduced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit having a gate array structure comprising:
    an intra-cell gate output section;
    an intra-cell power supply wiring section; and
    a plurality of isolation transistors connected in series to the intra-cell gate output section for connection to an intra-cell gate, wherein each of the isolation transistors is a PMOS transistor having a respective gate that is connected to the intra-cell power supply wiring section, and each of the isolation transistors remains in an off state.

2. A semiconductor integrated circuit having a gate array structure comprising:

an intra-cell gate output section;

an intra-cell ground wiring section; and a plurality of isolation transistors connected in series to the intra-cell gate output section for connection to an intra-cell gate, wherein each of the isolation transistors is an NMOS transistor having a respective gate connected to the intra-cell ground wiring section, and each of the isolation transistors remains in an off state.

3. A semiconductor integrated circuit having a gate array structure comprising:

an intra-cell gate output section;

an intra-cell first power supply wiring section and intra-cell first ground wiring section;

a plurality of first isolation transistors connected in series to the intra-cell gate output section for connection to an intra-cell gate, wherein each of the first isolation transistors is a PMOS transistor having a respective gate connected to the intra-cell first power supply wiring section;

an intra-cell second power supply wiring section and an intra-cell second ground wiring section; and a plurality of second isolation transistors connected in series to the intra-cell gate output section for connection to an intra-cell gate, wherein each of the second isolation transistors is an NMOS transistor having a respective gate that is connected to the intra-cell second ground wiring section, and each of the first and second isolation transistors remains in an off state.

4. A semiconductor integrated circuit having a gate array structure comprising:

an output section having an extra-cell gate;

an extra-cell power supply wiring section in a cell adjacent the extra-cell gate; and a plurality of isolation transistors connected in series to the output section for connection to the cell adjacent the extra-cell gate, wherein each of the isolation transistors is a PMOS transistor having a respective gate connected to the extra-cell power supply wiring section, and each of the isolation transistors remains in an off state.

5. A semiconductor integrated circuit having a gate array structure comprising:

an output section having an extra-cell gate;

an extra-cell ground wiring section in a cell adjacent the extra-cell gate; and a plurality of isolation transistors connected in series to the gate output section for connection to the cell adjacent the extra-cell gate, wherein each of the isolation transistors is an NMOS transistor having a respective gate connected to the extra-cell ground wiring section, and each of the isolation transistors remains in an off state.

6. A semiconductor integrated circuit having a gate array structure comprising:

an output section having an extra-cell gate;

an extra-cell first power supply wiring section and an extra-cell first ground wiring section in a cell adjacent the extra-cell;

a plurality of first isolation transistors connected in series to the extra-cell gate for connection to the cell adjacent the extra-cell, wherein each of the first isolation transistors is a PMOS transistor having a respective gate connected to the extra-cell first power supply wiring section;

an extra-cell second power supply wiring section and an extra-cell second ground wiring section in the cell adjacent the extra-cell; and a plurality of second isolation transistors connected in series to the extra-cell gate for connection to the cell adjacent the extra-cell gate, wherein each of the second isolation transistors is an NMOS transistor with a respective gate connected to the extra-cell second ground wiring section, and each of the first and second isolation transistors remains in an off state.

* * * * *